United States Patent
Liu et al.

(10) Patent No.: US 9,287,191 B2
(45) Date of Patent: Mar. 15, 2016

(54) SEMICONDUCTOR DEVICE PACKAGE AND METHOD

(75) Inventors: Hao-Juin Liu, Kaohsiung (TW); Chita Chuang, Kaohsiung (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 566 days.

(21) Appl. No.: 13/271,766

(22) Filed: Oct. 12, 2011

(65) Prior Publication Data

US 2013/0093075 A1    Apr. 18, 2013

(51) Int. Cl.
| | |
|---|---|
| H01L 21/58 | (2006.01) |
| H01L 23/31 | (2006.01) |
| H01L 21/56 | (2006.01) |
| H01L 23/36 | (2006.01) |
| H01L 23/42 | (2006.01) |
| H01L 23/498 | (2006.01) |
| H01L 23/00 | (2006.01) |

(52) U.S. Cl.
CPC .......... *H01L 23/3114* (2013.01); *H01L 21/563* (2013.01); *H01L 23/3142* (2013.01); *H01L 23/36* (2013.01); *H01L 23/42* (2013.01); *H01L 23/49838* (2013.01); *H01L 24/32* (2013.01); *H01L 24/16* (2013.01); *H01L 24/29* (2013.01); *H01L 24/83* (2013.01); *H01L 2224/13082* (2013.01); *H01L 2224/13111* (2013.01); *H01L 2224/13147* (2013.01); *H01L 2224/16225* (2013.01); *H01L 2224/26175* (2013.01); *H01L 2224/2919* (2013.01); *H01L 2224/2929* (2013.01); *H01L 2224/29339* (2013.01); *H01L 2224/29344* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01); *H01L 2224/83104* (2013.01); *H01L 2224/83191* (2013.01); *H01L 2224/83385* (2013.01); *H01L 2224/94* (2013.01); *H01L 2924/01322* (2013.01); *H01L 2924/12042* (2013.01); *H01L 2924/16251* (2013.01); *H01L 2924/181* (2013.01)

(58) Field of Classification Search
CPC .................. H01L 21/58; H01L 21/768; H01L 2924/01079; H01L 2924/01078; H01L 2924/01029; H01L 2224/48091
USPC .............................. 257/712, E23.08, E21.505
See application file for complete search history.

(56) References Cited

U.S. PATENT DOCUMENTS 6,023,098 A * 2/2000 Higashiguchi et al. ....... 257/712
6,157,085 A   12/2000 Terashima
(Continued)

FOREIGN PATENT DOCUMENTS

| CN | 1650410 A | 8/2005 |
|---|---|---|
| CN | 101728340 A | 6/2010 |
| CN | 102044517 A | 5/2011 |

*Primary Examiner* — Monica D Harrison
(74) *Attorney, Agent, or Firm* — Slater & Matsil, L.L.P.

(57) ABSTRACT

An embodiment is a structure. The structure comprises a substrate, a chip, and a reinforcement component. The substrate has a first surface, and the first surface comprises depressions. The chip is over and attached to the first surface of the substrate. The reinforcement component is over a first area of the first surface of the substrate. The first area is not under the chip. The reinforcement component has a portion disposed in at least some of the depressions in the first area.

18 Claims, 4 Drawing Sheets

(56) References Cited

U.S. PATENT DOCUMENTS

| | | | |
|---|---|---|---|
| 6,204,454 B1 * | 3/2001 | Gotoh et al. | 257/704 |
| 6,882,041 B1 * | 4/2005 | Cheah et al. | 257/704 |
| 7,116,557 B1 * | 10/2006 | Raby et al. | 361/720 |
| 8,445,990 B2 * | 5/2013 | Lin et al. | 257/531 |
| 2010/0096747 A1 * | 4/2010 | Kusano | 257/706 |
| 2011/0169155 A1 | 7/2011 | Ogihara | |

* cited by examiner

SEMICONDUCTOR DEVICE PACKAGE AND METHOD

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

However, some FcCSP packages tend to exhibit bending, where warping of the substrate occurs during processing, such as during temperature stress. The bending can cause reliability issues, such as bond breakage of the bumps, delamination of an underfill, and delamination of a passivation layer on the die.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages, or for other structures within a package, such as for an interposer or other active chip in a two and a half dimensional integrated circuit (2.5DIC) structure or a three dimensional IC (3DIC) structure.

Figure 1:
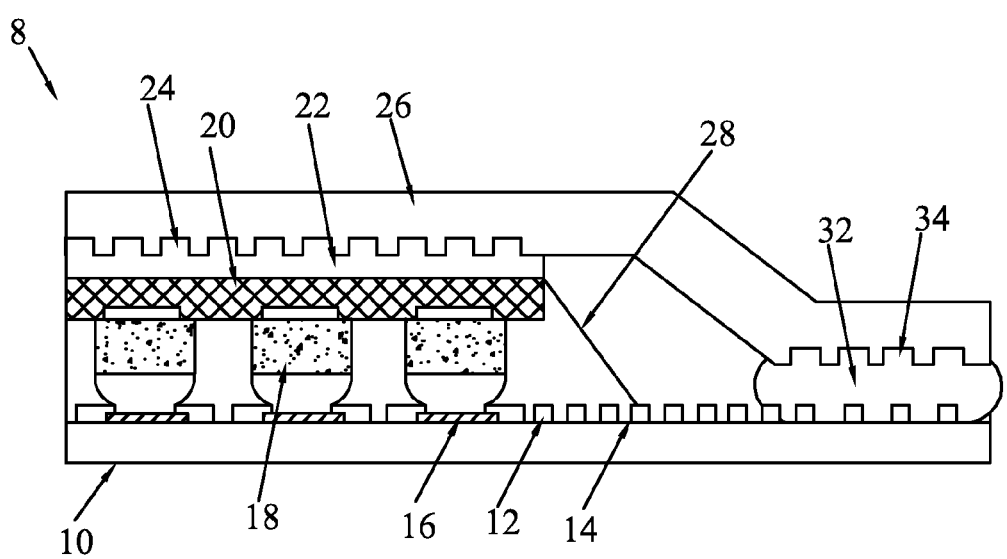
FIG. 1 is a portion of a chip scale package (CSP) structure according to an embodiment.

FIG. 1 is a portion of a CSP structure 8 according to an embodiment. The structure 8 comprises a substrate 10, a chip 20, and a lid 26. The chip 20 is attached on a top surface of the substrate 10 by electrical connectors 18 on respective pads 16 of the substrate 10. The substrate 10 has a layer 12 on the top surface. The layer 12 has openings 14 through the layer 12 to the top surface of the substrate 10, in an area under the chip 20 and in an area not under the chip 20. An underfill material 28 is between the chip 20 and the top surface of the substrate 10 and around the electrical connectors 18. The underfill material 28 is further in some of the openings 14 on the top surface of the substrate 10 under and proximate the chip 20. The underfill material 28 may provide further mechanical coupling and support between the chip 20 and the substrate 10.

The lid 26 is over the chip 20 and conforms to the chip 20 and the substrate 10 such that the lid 26 bends toward the top surface of the substrate 10 as the lid 26 extends away from the chip 20. A thermal interface material 22 interfaces between a top surface of the chip 20 and the lid 26. A bottom part of a portion of the lid 26 over the chip 20 has recesses 24. The thermal interface material 22 is disposed in the recesses 24 of the lid 26. A bottom part of a flange portion of the lid 26 away from the chip 20 has recesses 34. An adhesive 32 is between the flange portion of the lid 26 and the top surface of the substrate 10. The adhesive 32 is in recesses 34 of the lid 26 and openings 14 in the layer 12.

The lid 26 in this embodiment is formed, for example, by using a metal press. The recesses 24 and 34 in the lid 26 are formed, for example, by using a molding having a pattern corresponding to the recesses 24 and 34 when pressing the lid 26. The lid 26 in this embodiment is steel and, in other embodiments, can be copper, stainless steel, the like, or a combination thereof. The recesses 24 and 34 have dimensions, for example, a depth between approximately 10 μm and 100 μm and a width of the depicted cross section between approximately 10 μm and 100 μm. It should be noted that embodiments contemplate other dimensions of these recesses 24 and 34, and that optimum dimensions for an application may be determined without undue experimentation.

The substrate 10 in this embodiment is an organic substrate comprising Ajinomoto Build-up Film (ABF), and the layer 12 is a solder resist, polyimide, and/or a photoresist with a thickness of between approximately 10 μm and approximately 20 μm. The substrate 10 can be formed by acceptable techniques, and the layer 12 is formed by coating and patterning using photolithography to form the openings 14. Other materials can be used for the layer 12, such as ceramic, plastic, organic material, the like, or a combination thereof. In this embodiment, the openings 14 have dimensions, such as depth is between approximately 10 μm and 20 μm corresponding to the thickness of the layer 12 although other depths may be used and a width of the depicted cross section is between approximately 10 μm and 20 μm. It should be noted that embodiments contemplate other dimensions of the openings 14, and that optimum dimensions for an application may be determined without undue experimentation.

The chip 20 can be formed according to acceptable techniques, and embodiments contemplate a chip with any functionality. The electrical connectors 18 in this embodiment are metal posts, such as copper, with a lead free solder, such as a eutectic material such as SnAgCu ("SAC"), formed thereon. The electrical connectors 18 can also be ball grid array (BGA)

balls, or the like, formed by acceptable methods. The chip 20 is attached to the substrate 10 using, for example, a pick-and-place tool, and the electrical connectors 18 are reflowed.

The thermal interface material 22 is formed on the top surface of the chip 20, for example, by coating the thermal interface material 22 on a wafer comprising the chip 20 before the chip 20 is singulated from the wafer. The chip 20 is then placed, using the pick-and-place tool, on the substrate 10 with the thermal interface material 22 on the top surface of the chip 20. The thermal interface material 22 may be a thermally conductive and electrically insulative material, such as an epoxy, like an epoxy mixed with a metal like silver or gold, a "thermal grease," a "white grease," the like, or a combination thereof.

The underfill material 28 is dispensed after the electrical connectors 18 are reflowed using an acceptable dispensing tool. The underfill material 28 is then cured. The underfill material 28 can be a liquid epoxy, deformable gel, silicon rubber, the like, or a combination thereof.

The adhesive 32 is applied to the periphery of the substrate 10 using, for example, appropriate dispensing equipment. The lid 26 is then placed over the chip 20 and the substrate 10, such as by using a pick-and-place tool, and the adhesive 32 is cured. The adhesive can be a glue, polymer, epoxy, film, the like, or a combination thereof.

Figure 2A:
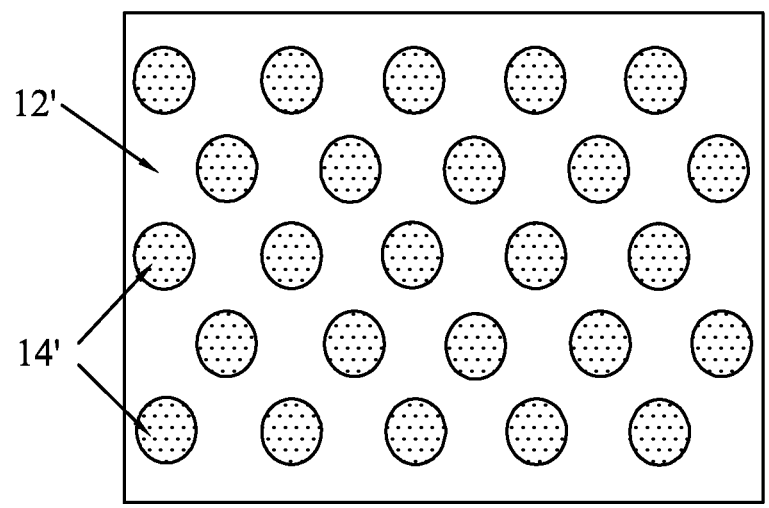
FIGS. 2A and 2B are example patterns of a layer and openings according to an embodiment.
Figure 2B:
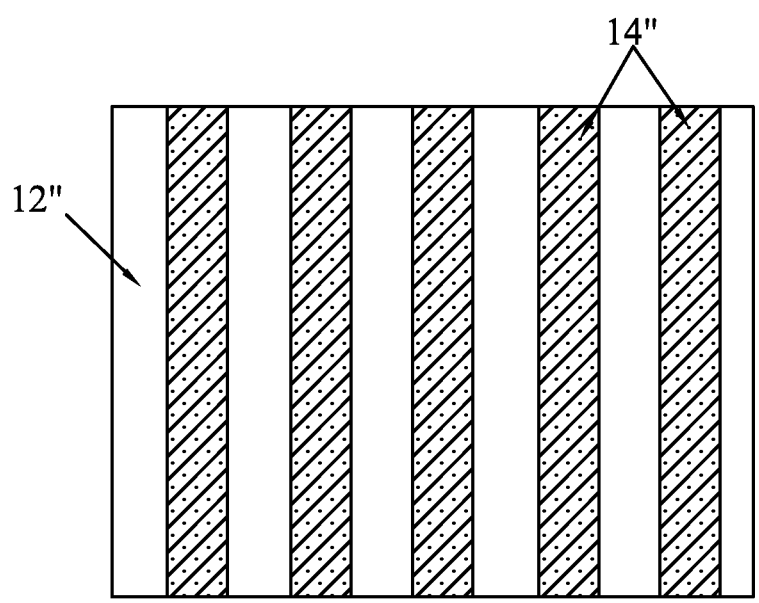

FIGS. 2A and 2B are example patterns of the layer 12 and the openings 14. It should be noted that the same or similar patterns may be formed for the recesses 24 and 34 in the lid 26. In FIG. 2A, a first opening 14' in a first layer 12' has a circular cross section in a plane parallel to the top surface of the substrate 10. In FIG. 2B, a second opening 14" in a second layer 12" has a trench cross section in a plane parallel to the top surface of the substrate 10. These are two examples of patterns, and other embodiments contemplate other cross sectional patterns, such as rectangular, hexagonal, octagonal, elliptical, the like, or a combination thereof.

Figure 3:
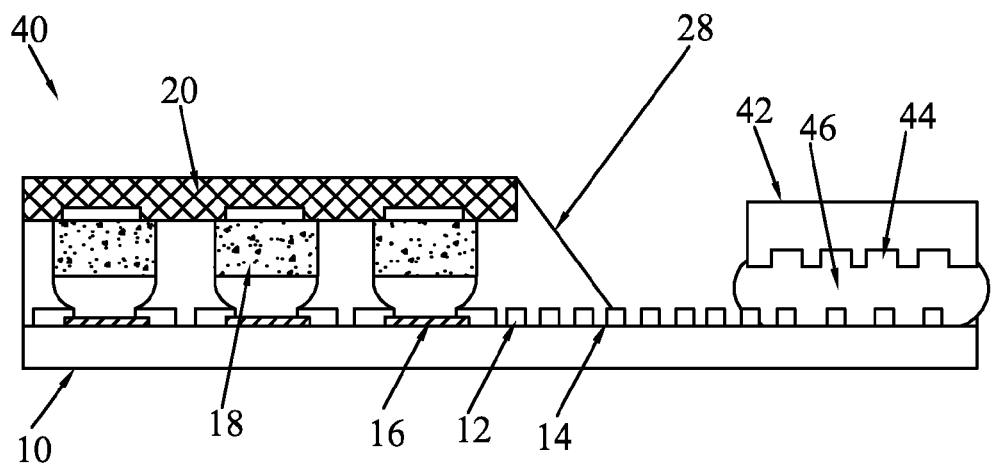
FIG. 3 is a portion of another CSP structure according to an embodiment.

FIG. 3 is a portion of another CSP structure 40 according to an embodiment. The structure 40 comprises many of the same components of the structure 8 in FIG. 1, which are referenced by same reference numerals. Accordingly, explicit description of those components is omitted for brevity. The structure 40 does not comprise the lid 26 in FIG. 1 and comprises a ring 42 along a periphery of the substrate 10 around the chip 20 and not over a top surface of the chip 20. The ring 42 has recesses 44 in a bottom part. An adhesive 46 is between the top surface of the substrate 10 and the bottom part of the ring 42, and the adhesive 46 is disposed in the recesses 44 of the ring 42 and in the openings 14 of the layer 12 that are in an area not under the chip 20.

The recesses 44 in the ring 42 are formed by a metal press with a molding having a pattern corresponding to the recesses 44. The recesses 44 in the ring 42 can be formed with a pattern and dimensions the same as or similar to, for example, the recesses 34 in the lid 26 of FIG. 1. The ring 42 can be steel, stainless steel, copper, the like, or a combination thereof. Similar to the adhesive 32 of FIG. 1, the adhesive 46 can be applied to the top surface of the substrate 10. The ring 42 can be placed over the adhesive 46 using a pick-and-place tool, and the adhesive 46 can be cured.

Figure 4:
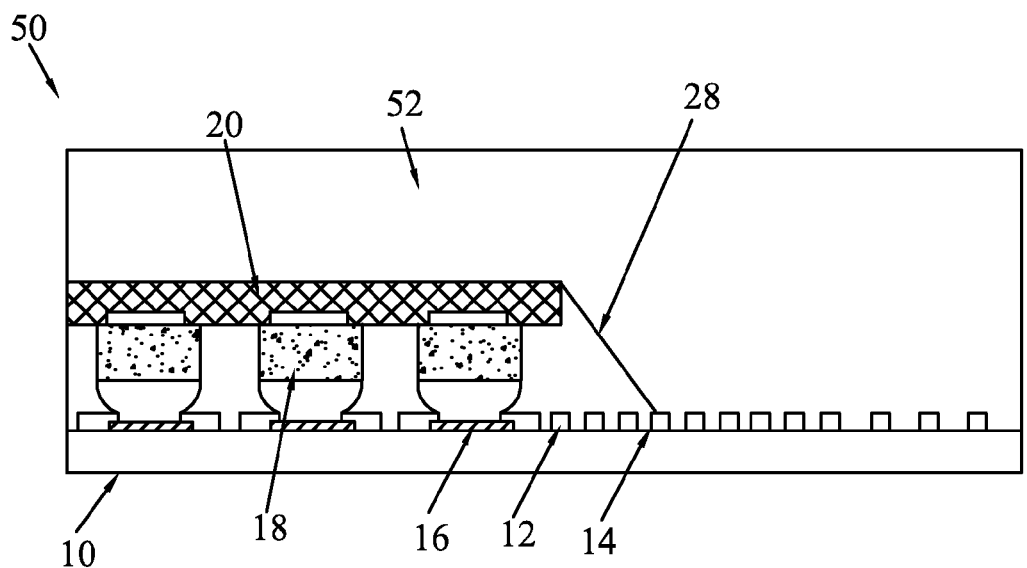
FIG. 4 is a portion of a further CSP structure according to an embodiment.

FIG. 4 is a portion of a further CSP structure 50 according to an embodiment. The structure 50 comprises many of the same components of the structure 8 in FIG. 1, which are referenced by same reference numerals. Accordingly, explicit description of those components is omitted for brevity. The structure 50 does not comprise the lid 26 in FIG. 1 and comprises a molding compound 52 encapsulating the chip 20 and the top surface of the substrate 10. The molding compound 52 is in some of the openings 14 of the layer 12 in an area not under the chip 20. The molding compound 52 is applied using, for example, compression molding.

Figure 5:
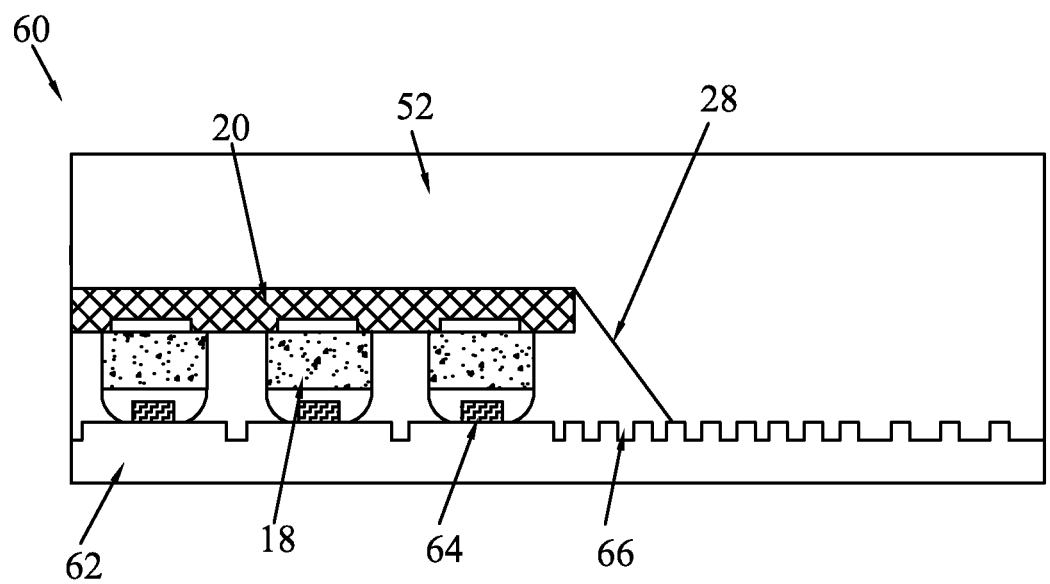
FIG. 5 is a portion of yet another CSP structure according to an embodiment.

FIG. 5 is a portion of yet another CSP structure 60 according to an embodiment. The structure 60 comprises many of the same components of the structure 50 in FIG. 5, which are referenced by same reference numerals. Accordingly, explicit description of those components is omitted for brevity. The substrate 10 and layer 12 of FIG. 5 is replaced with a substrate 62, and the substrate 62 uses bump on trace (BOT) technology. The substrate 62 comprises conductive traces 64 upon which the electrical connectors 18 are attached and reflowed. The substrate 62 has recesses 66 formed in a top surface of the substrate 62. The molding compound 52 is in the recesses 66 in an area not under the chip 20, and the underfill material 28 is in the recesses 66 under the chip 20.

The recesses 66 can be formed in a same or similar pattern as the openings 14 in FIG. 5 with the same or similar dimensions. The recesses 66 are formed, for example, using acceptable photolithography and/or etching processes, such as a wet or dry etch, or by laser trimming. An example etching process is a wet etch using phosphoric acid ($H_3PO_4$). It should be noted that substrates similar to the substrate 62 generally comprise multiple layers, and the recesses 66 may extend into one or more layers of the substrate 62. Further, these features of the substrate 62 can be applied to the previous embodiments discussed.

Embodiments may have enhanced adhesion of various components in a CSP structure which may result in reduced stress in areas within the structure. In the disclosed embodiments, by having the underfill material in the openings and/or recesses of the substrate, the underfill material has a larger area to contact to allow for greater adhesion to the substrate. Similarly, the molding compound or adhesive in the various embodiments can have greater adhesion with the substrate by being in the openings and/or recesses of the substrate. Also, the recesses in the lid or ring allows for greater adhesion of the adhesive. The greater adhesion to the lid, ring, and/or molding compound may allow those components to absorb much of the stress created when the substrate begins to warp, such as during steps comprising heating. The absorbed stress can thus be diverted from the electrical connectors, underfill material, etc. to possibly prevent failures which would otherwise be caused by the stress.

An embodiment is a structure. The structure comprises a substrate, a chip, and a reinforcement component. The substrate has a first surface, and the first surface comprises depressions. The chip is over and attached to the first surface of the substrate. The reinforcement component is over a first area of the first surface of the substrate. The first area is not under the chip. The reinforcement component has a portion disposed in at least some of the depressions in the first area.

Another embodiment is a structure. The structure comprises a substrate, a chip, an underfill material, and a component. The substrate has depressions in a top surface. The chip is attached to the top surface. The underfill material is between the top surface of the substrate and the chip. The underfill material is in at least some of the depressions in a first area of the top surface of the substrate, and the first area underlies the chip. The component is selected from the group consisting essentially of a (1) lid and a first adhesive, (2) a ring and a second adhesive, and (3) a molding compound. The component is on the top surface of the substrate and has a portion disposed in at least some of the depressions in a second area of the top surface of the substrate. The second area does not underlie the chip.

A further embodiment is a method. The method comprises providing a substrate having depressions in a top surface, attaching a chip to the top surface of the substrate, and providing a reinforcement component on the top surface of the substrate. A portion of the reinforcement component being is in at least some of the depressions.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a substrate having a first surface, separate depressions extending into the substrate from the first surface of the substrate;
   a chip over and attached to the first surface of the substrate; and
   a reinforcement component over a first area of the first surface of the substrate, the first area not being under the chip, the reinforcement component having a portion disposed in at least some of the depressions in the first area, wherein the reinforcement component comprises a lid and an adhesive, the lid having a first portion over the chip and a second portion over the first area of the first surface of the substrate, the adhesive being between the second portion of the lid and the first surface of the substrate, the adhesive being disposed in the at least some of the depressions in the first area.

2. The structure of claim 1, wherein the substrate comprises a layer and an underlying substrate, the layer being over the underlying substrate, the depressions being openings through the layer.

3. The structure of claim 1, wherein the depressions are recesses in the first surface of the substrate.

4. The structure of claim 1 further comprising an underfill material between the chip and the substrate, the underfill material being disposed in a plurality of the depressions in a second area of the first surface of the substrate, the second area being under the chip.

5. The structure of claim 1, wherein the second portion of the lid comprises lid depressions, the adhesive being disposed in at least some of the lid depressions.

6. The structure of claim 1 further comprising a thermal interface material between a surface of the chip and the first portion of the lid, the first portion of the lid comprising lid depressions, the thermal interface material being disposed in at least some of the lid depressions.

7. The structure of claim 1, wherein an active surface of the chip is facing the first surface of the substrate, external electrical connectors being directly attached to the active surface and the first surface, the external electrical connectors mechanically and electrically coupling the chip to the substrate.

8. The structure of claim 1, wherein the reinforcement component at least laterally encircles the chip over the first area.

9. A structure comprising:
   a substrate having a first surface, separate depressions extending into the substrate from the first surface of the substrate;
   a chip over and attached to the first surface of the substrate; and
   a reinforcement component over a first area of the first surface of the substrate, the first area not being under the chip, the reinforcement component having a portion disposed in at least some of the depressions in the first area, wherein the reinforcement component comprises a ring and an adhesive, the ring being around the chip and over the first area, the adhesive being between the ring and the first surface of the substrate, the adhesive being disposed in the at least some of the depressions in the first area.

10. The structure of claim 9, wherein the ring comprises ring depressions, the adhesive being disposed in at least some of the ring depressions.

11. The structure of claim 9, wherein the portion of the reinforcement component is disposed in a plurality of the depressions in the first area.

12. A structure comprising:
    a substrate having depressions in a top surface;
    a chip attached to the top surface by external electrical connectors directly attached between the chip and the top surface of the substrate;
    an underfill material between the top surface of the substrate and the chip, the underfill material being around the external electrical connectors, the underfill material being in at least some of the depressions in a first area of the top surface of the substrate, the first area underlying the chip; and
    a component selected from the group consisting essentially of a lid and a first adhesive, a ring and a second adhesive, and a molding compound, the component being on the top surface of the substrate and having a portion disposed in a plurality of the depressions in a second area of the top surface of the substrate, the second area not underlying the chip.

13. The structure of claim 12, wherein the component is the lid and the first adhesive, the lid being over the chip, the lid having first lid depressions in a first portion of the lid overlying the chip and having second lid depressions in a second portion of the lid overlying the first area, a thermal interface material being between the chip and the first portion and disposed in at least some of the first lid depressions, the first adhesive being disposed in at least some of the second lid depressions and being disposed in the plurality of the depressions in the second area.

14. The structure of claim 12, wherein the component is the ring and the second adhesive, the ring being around the chip, the ring having ring depressions, the second adhesive being disposed in at least some of the ring depressions and being disposed in the plurality of the depressions in the second area.

15. The structure of claim 12, wherein the component is the molding compound, the molding compound being in the plurality of the depressions in the second area.

16. The structure of claim 12, wherein the substrate comprises a layer and an underlying substrate, the layer being over the underlying substrate, the depressions being openings through the layer.

17. The structure of claim 12, wherein the component at least laterally surrounds the chip over the second area of the top surface of the substrate.

18. A structure comprising:
- a substrate having a top side, the top side having depressions, the top side having a chip-attach area and a periphery area, the periphery area being distinct from the chip-attach area;
- a chip having an active side, external electrical connectors attaching the active side of the chip to the chip-attach area of the top side of the substrate, the active side of the chip facing the top side of the substrate, the periphery area not being under the chip;
- an underfill material disposed between active side of the chip and the chip-attach area of the top side of the substrate, the underfill material being disposed around the external electrical connectors and disposed in a first plurality of the depression in the chip-attach area of the top side of the substrate; and
- a reinforcement component at least laterally encircling the chip and over the periphery area of the top side of the substrate, the reinforcement component having a portion disposed in a second plurality of the depressions in the periphery area of the top side of the substrate.

* * * * *